United States Patent [19]

Iida et al.

[11] Patent Number: 4,780,855
[45] Date of Patent: Oct. 25, 1988

[54] SYSTEM FOR CONTROLLING A NONVOLATILE MEMORY HAVING A DATA PORTION AND A CORRESPONDING INDICATOR PORTION

[75] Inventors: Norihiko Iida; Kazuhide Kawata, both of Tokyo, Japan

[73] Assignee: NEC Corporation, Tokyo, Japan

[21] Appl. No.: 747,610

[22] Filed: Jun. 21, 1985

[30] Foreign Application Priority Data

Jun. 21, 1984 [JP] Japan ................................. 59-127772

[51] Int. Cl.⁴ .............................................. G11C 8/00
[52] U.S. Cl. ....................................... 365/230; 365/185
[58] Field of Search ................. 365/49, 189, 230, 174, 365/185, 183, 228

[56] References Cited

U.S. PATENT DOCUMENTS

| | | | |
|---|---|---|---|
| 3,685,020 | 8/1972 | Meade | 365/200 X |
| 3,733,591 | 5/1973 | Cricchi | 365/230 X |
| 3,882,470 | 5/1975 | Hunter | 365/200 |
| 4,168,541 | 9/1979 | DeKarske | 365/230 |
| 4,244,033 | 1/1981 | Hattori | 365/49 X |
| 4,263,664 | 4/1981 | Owen et al. | 365/230 X |
| 4,296,467 | 10/1981 | Nibby, Jr. et al. | 365/230 X |
| 4,386,402 | 5/1983 | Toy | 365/230 X |

Primary Examiner—Stuart N. Hecker
Assistant Examiner—Alyssa Bowler
Attorney, Agent, or Firm—Sughrue, Mion, Zinn, Macpeak & Seas

[57] ABSTRACT

A nonvolatile memory (programmable) comprises a plurality of logic memories, each of which is composed of a plurality of memory segments. Each of the memory segments is constituted of a first nonvolatile memory area capable of storing data of a predetermined bit number and a second nonvolatile memory area containing an identifier for the corresponding first nonvolatile memory area. Each of the logical memories is given one logical address, and when write operation is executed, a controller operates to access to the logical memory identified by the inputted logical address so as to erase in the accessed logical memory the memory segment having the identifier indicating that the data is stored, and to write the inputted data to the memory segment next to the erased memory segment.

9 Claims, 5 Drawing Sheets

FIGURE 3

| LOGICAL ADDRESS | PHYSICAL ADDRESS | DATA BIT NO. | | | | | | | |
|---|---|---|---|---|---|---|---|---|---|
| | | 7 | 6 | 5 | 4 | 3 | 2 | 1 | 0 |
| 0 | 0 $\sim$ $F_{16}$ | IDENTIFIER | | | | | | | |
| 1 | $10_{16}$ $\sim$ $1F_{16}$ | | | | | | | | |
| | | | | | | | | | |
| $F_{16}$ | $F0_{16}$ $\sim$ $FF_{16}$ | | | | | | | | |

NOTE: SUFFIX 16 SHOWS HEXADECIMAL NOTATION.

SYSTEM FOR CONTROLLING A NONVOLATILE MEMORY HAVING A DATA PORTION AND A CORRESPONDING INDICATOR PORTION

FIELD OF THE INVENTION

The present invention relates to a nonvolatile memory, and more particularly to a nonvolatile memory made of memory cells which have a limited number of write cycles.

DESCRIPTION OF THE PRIOR ARTS

At present, nonvolatile memory cells of two types are employed, that is, the magnetic type and the charge storing type.

Although the number of write cycles for this type cell is not limited in practice, the memory cell is ordinarily of a large size so that it is difficult to assemble together with other circuits in a single semiconductor chip.

On the other hand, the memory cells of the latter type can be easily fabricated in the form of an integrated circuit. The memory of the charge storing type is typically represented by a semiconductor memory called "nonvolatile random access memory," which is constituted of a combination of static random access memory (static RAM) cells and electrically erasable programmable read only memory (EEPROM) cells. The EEPROM cell is ordinarily adapted to be written with information by injecting an electrical charge into a floating gate by means of an avalanche phenomenon or a tunnel effect. Because of this, repeated cycles of writing and erasing (with cycles) will lead to degradation of the memory cells, so that the memory of this type has a limitation on the number of write cycles. Thus, the memory cells of the charge storing type have been used only in the cases where a small number of write cycles is expected.

Accordingly, it has long been demanded to develop a nonvolatile memory which can be realized as an integrated circuit while a large number of writing cycles is possible.

OBJECT OF THE INVENTION

It is a main object of the present invention to resolve the above mentioned problem of the prior art, and more particularly to provide a nonvolatile memory which is readily manufactured in the form of an integrated circuit and which can be integrated on a single semiconductor chip with other circuits, for example, a microprocessor.

It is another object of the present invention to provide a memory comprising programmable memory cells, in which a large number of write cycles is possible.

SUMMARY OF THE INVENTION

According to the present invention, there is provided a nonvolatile memory (programmable) comprising a plurality of logic memories, each of which is composed of a plurality of memory segments, each of said memory segments being constituted of a first nonvolatile memory area capable of storing data of a predetermined bit number and a second nonvolatile memory area containing an identifier for the corresponding first nonvolatile memory area.

In the nonvolatile memory as mentioned above, the first nonvolatile memory area is adapted to store one word constituted of a predetermined number of bits, and the second nonvolatile memory area has a capacity of at least one bit, so that the identifier contained in the second nonvolatile memory area indicates whether or not the first nonvolatile memory area associated to that second nonvolatile memory area stores any data.

According to a preferred embodiment of the present invention, the first and second nonvolatile memory areas are made of the memory cells of the charge storing type.

According to the present invention, there is further provided a memory comprising:

at least one programmable memory circuit, said programmable memory circuit including a plurality of memory segments, each memory segment being constituted of a first memory area for storing data of a predetermined number of bits and a second memory area containing an identifier for indicating whether or not said first memory area stores data; and a controller which responds to a control signal and searches a memory segment storing the inputted data with reference to the identifier in the second memory area.

BRIEF DESCRIPTION OF THE ACCOMPANYING DRAWINGS

FIG. 3 shows a memory map of NVRAM of the nonvolatile memory shown in FIG. 2;

DESCRIPTION OF THE PREFERRED EMBODIMENTS

Figure 1:
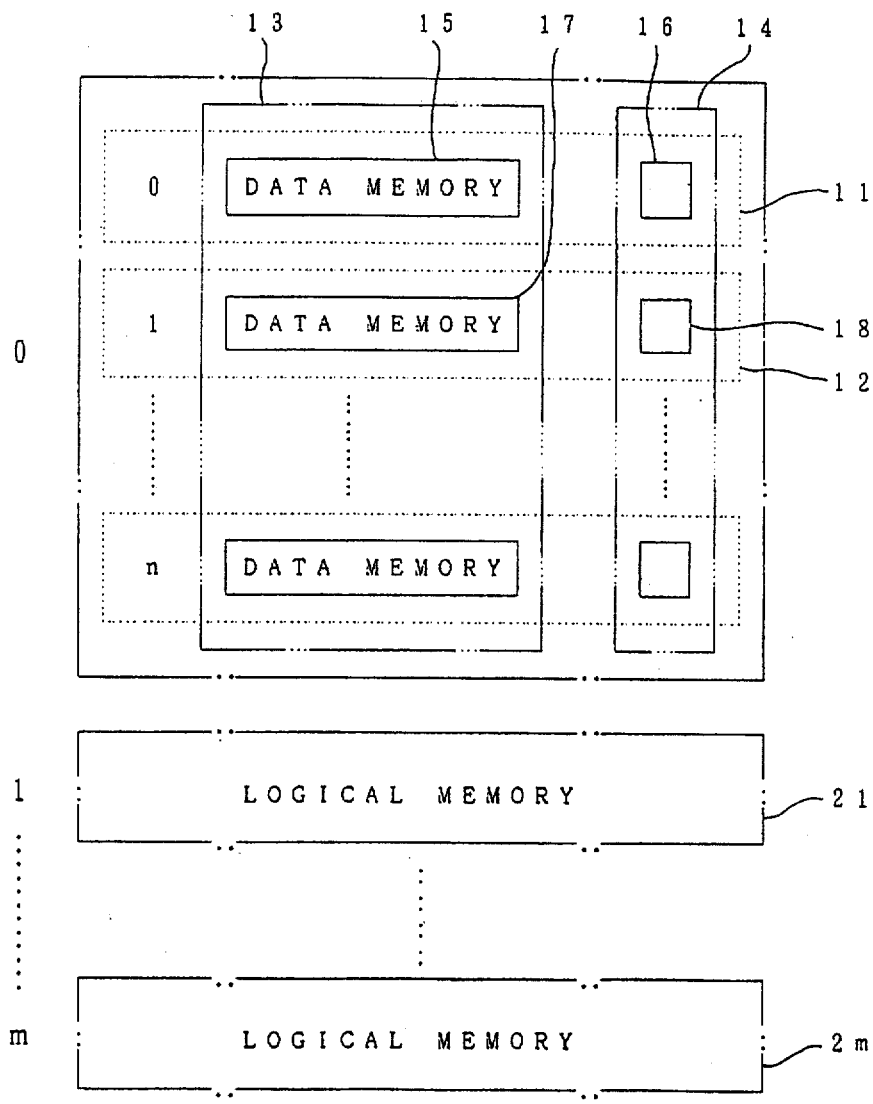
FIG. 1 illustrates structure embodying the principle of the present invention.

The basic principle of the present invention may be explained with reference to FIG. 1 which illustrates schematically the structure of the memory used in the nonvolatile memory according to the present invention.

The memory comprises a plurality of logic memories 20, 21, ... 2m, totalling (m+1) in number, which have respective addresses 0, 1, ... m.

Each of the logic memories comprises (n+1) memory segments 11, 12, ... which have respectively physical addresses 0, 1, ... n. The logic memory is divided into two sections, that is, a first nonvolatile memory section 13 and a second nonvolatile memory section 14, so that each of the memory segments is divided a first nonvolatile memory area 15, 17 ... and a second nonvolatile memory area 16, 18, ....

The first nonvolatile memory area 15, 17 ... is composed of a plurality of memory cells for storing therein data of a predetermined bit length. On the other hand, the second nonvolatile memory area 16, 18, ... is composed of, for example, a single memory cell for storing an identifying signal (an "identifier") which indicates the storing state of the first nonvolatile memory area of the same memory segment. Thus, the logic memory is composed of (n+1) memory segments each consisting of a data memory for storing data and an identifier therefor.

As mentioned above, in a single logic memory (20, 21, 2m), only one of the n+1 memory segments (11 or 12 . . . ) stores data in its data memory (15 or 17 . . . ) and the corresponding identifier is written with, for example, "1" in order to indicate its storing state. Then, at the same time, the other identifiers are written, for example, with "0" for indicating that the corresponding data memories do not store data.

In the initialized state, the identifier 16, of which the physical address is "0", is a "1" and the other identifiers of the same logic memory are all a "0".

When writing a data in the logic memory 20 which is initialized, the most significant bits of the memory segments are sequentially read to seek an identifier of "1". In this case where the memory is initialized, only the identifier 16 of the memory segment 11 is "1". In practice, the identifier of "1" can be found out by reading sequentially the identifiers of the memory segments. Such a reading can be completed at most by 16 readings of the identifiers.

When the identifier of "1" is found, the memory segment to which the identifier of "1" is related is totally erased. Then, the identifier is changed to "0".

Next in sequence, data is written into the memory segment 12 which has a physical address next to that of the memory segment 11 which has just been erased. The data is written the first nonvolatile memory area 17 and its identifier (the second nonvolatile memory area 18) is changed to "1". At the completion of the writing operation, only the identifier 18 in the second nonvolatile memory section 14 of the logic memory is a "1".

At the time of rewriting the data, the memory segment having an identifier "1" is erased, that is, the data stored in the data memory is erased and its identifier is changed to "0". Then, the new data is stored in the data memory of the memory segment positioned next to the data segment which was erased, and its identifier is changed to "1".

In case the memory segment "n", which is positioned at the lowermost row of the logic memory shown in FIG. 1, contains data and is to be erased, it is the memory segment of the first row which is to be stored with the newly inputted data and of which the identifier is to be changed to "1". If data is to be stored in the memory without erasing the formerly stored data, only the identifier for the memory having the data need be changed to "0" without erasing the data. In the manner, data would be written into the next positioned memory segment.

The reading of data is conducted by accessing the logic memory with the inputted logic address, seeking the memory segment having an identifier of "1" in the same manner as described above and reading out the first nonvolatile memory area thereof. In this case, the identifier is not changed.

As explained above, the nonvolatile memory shown in FIG. 1 is controlled in such a manner that writing is executed sequentially into the data memory positioned next to the data memory which was formerly stored with data. Because a write cycle in data memory occurs only once every m+1 write cycles for a logical memory, the total number of possible writing cycles of the memory becomes (m+1)k, in which k indicates the number of possible writing cycles which is determined by the nature of the memory cells constituting the memory.

Figure 2:
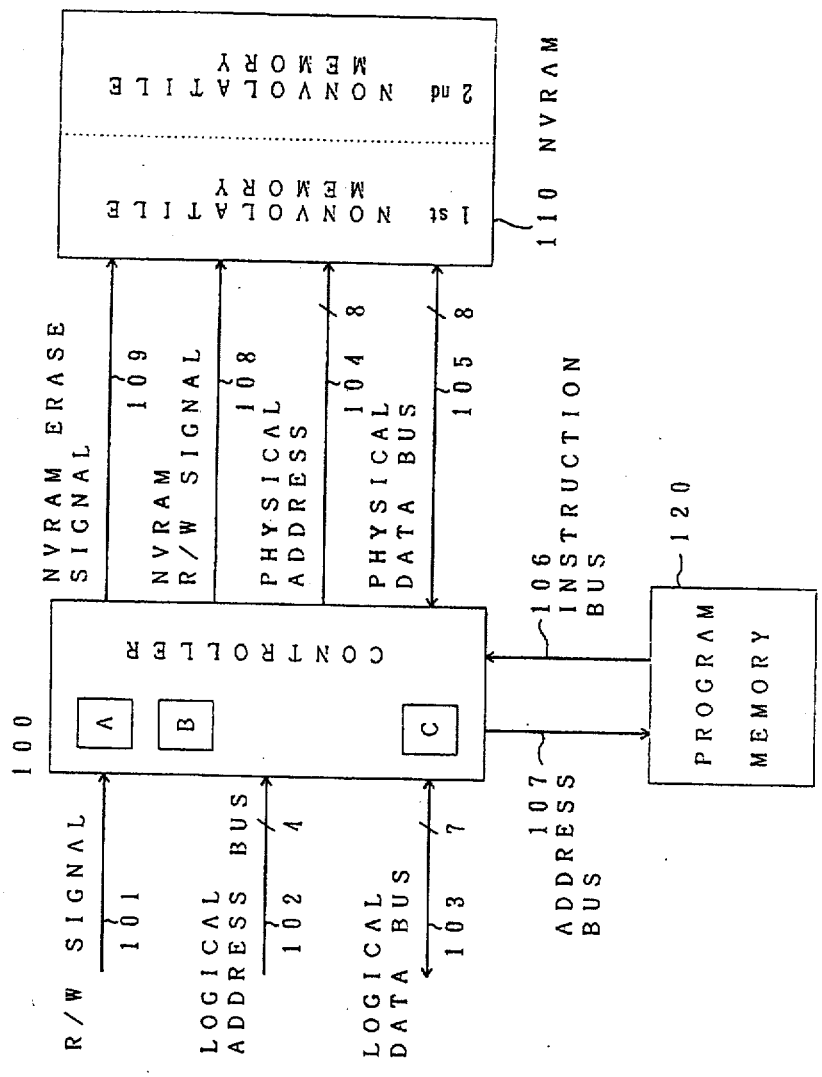
FIG. 2 is a schematic diagram of a example of the nonvolatile memory according to the present invention.

FIG. 2 is a block diagram of the nonvolatile memory according to an embodiment of the present invention. The nonvolatile memory shown in FIG. 2 consists of three main components, that is, a controller 100, a nonvolatile random access memory (which will be abbreviated as NVRAM hereinafter) 110 and a program memory 120.

The controller 100 is for example composed of a microprocessor which contains two address buffers or temporary registers A and B, an instruction register C and other various registers and decoders well known in the art. In this case, each of the two temporary registers A and B has a capacity or length of 8 bits. The controller 100 also has a data read/write signal line 101 for receiving external read/write instruction, a logic address bus 102 for receiving the address of the memory to be accessed, and a logic data bus 103 for receiving from and supplying data to an external source. In the illustrated example, the logic address bus 102 carries 4 bits and the logic data bus 103 carries 7 bits.

On the other hand, the controller 100 is adapted to receive through an instruction bus 106 programed instructions from the program memory 120, and to output a count value of the internal instruction register C through an address bus 107 to the program memory 120.

Further, the controller 100 is connected with NVRAM 110 through a physical address bus 104, a physical data bus 105, an NVRAM read/write signal line 108, and an NVRAM erase signal line 109.

FIG. 3 illustrates an example of the memory map of NVRAM 110. NVRAM 110 comprises 16 logic memories each consisting of 16 rows of memory segments of 8 bits. In the memory segment, the most significant bit position is used to store an identifier, and the seven bits lower order are used as a data memory. In this logic memory, each memory segment has one physical address which is represented in hexadecimal notation. The addresses of the logic memories are also represented in hexadecimal notation. As mentioned above with reference to FIG. 1, only one data memory is stored with data at one time in a single logic memory. Then, NVRAM 110 operates as a nonvolatile memory of 16 words each having a data length of 7 bits.

Now, the operation of the nonvolatile memory shown in FIG. 2 will be explained with reference to FIGS. 4 and 5.

Figure 4:
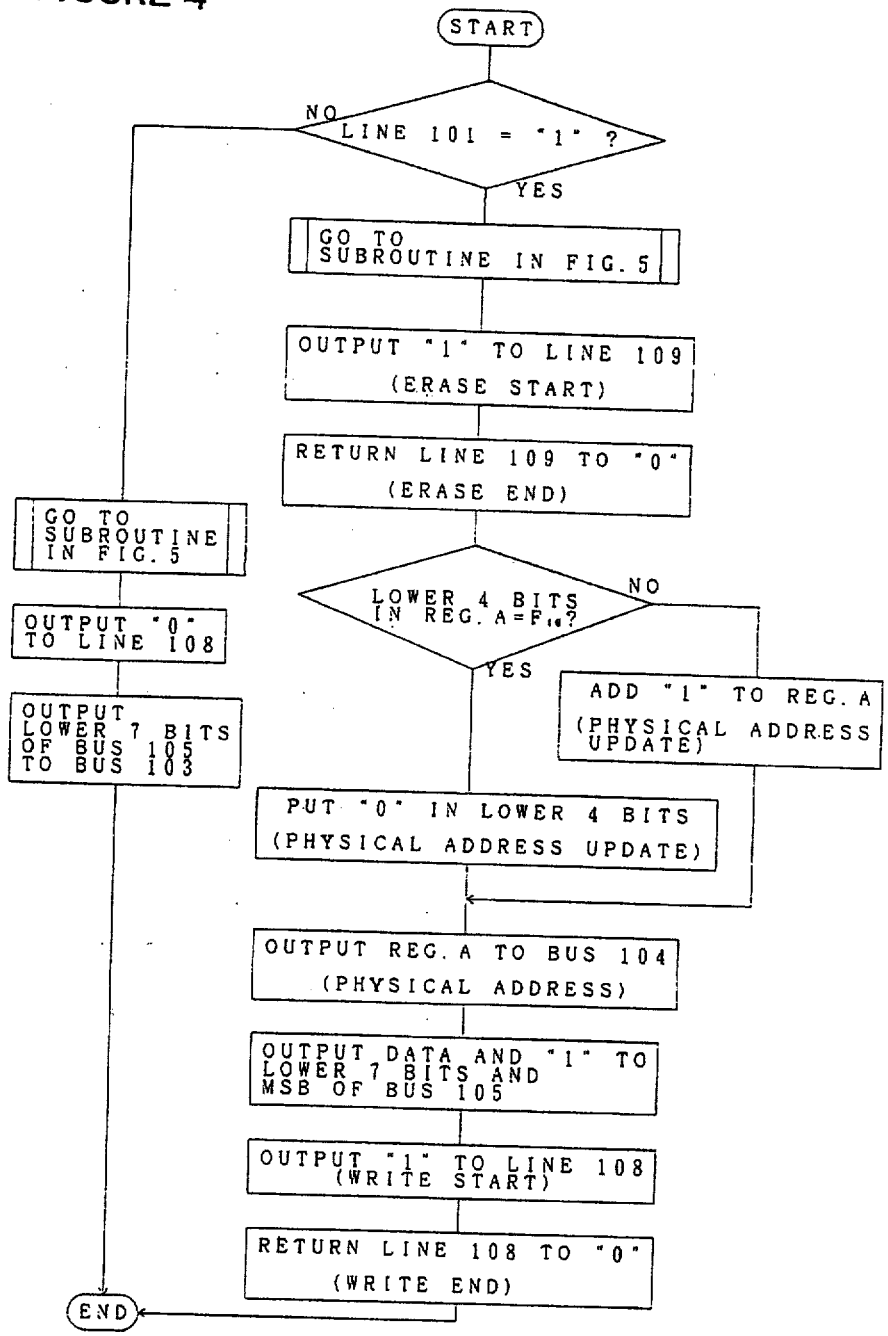
FIG. 4 is a flow chart of the main program stored in the program memory of the nonvolatile memory shown in FIG. 2.
Figure 5:
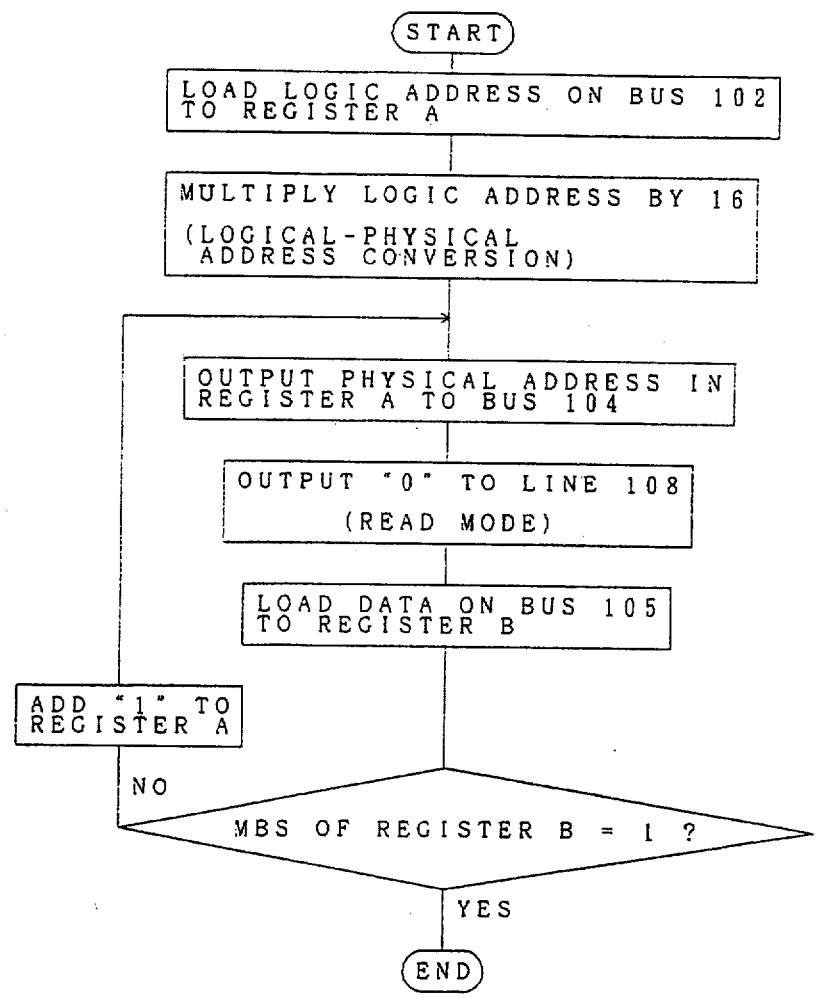
FIG. 5 is a flow chart of the subroutine of the main program.

FIGS. 4 and 5 are respectively a flow chart of a main program contained in the program memory 120 and a flow chart of a subroutine used in said main program.

The operation of the controller 100 is as follows:

First, the controller 100 judges whether the data read/write signal 101 is "0" or "1". When it is "1" which means a write instruction is present, the subroutine shown in FIG. 5 is executed in order to find out the data segment of which the identifier is "1".

In the subroutine shown in FIG. 5, first, a logic address transmitted through the logic address bus 102 is stored in the temporary register A in the controller 100. Then, the content of the temporary register A is multiplied by 16, that is, shifted towards the left by 4 bits to convert the logic address into the physical address. The physical address thus obtained is outputted to the physical address bus 104 and then "0" is outputted to the NVRAM read/write signal line 108 to read the memory segment of the same physical address. The content of said memory segment transmitted through the physical data bus 105 is stored in the temporary register B in the controller 100. Then the identifier, that is, the most significant bit of the temporary register B, is judged as a "1" or "0".

When the identifier is "1", it is the memory segment to be modified, and thus the subroutine is finished. When the identifier is "0", a "1" is added to the content of the temporary register A is and the register content is outputted to the physical address bus 104 in order to read the memory segment of the physical address of next higher number. This sequential reading operation is continued until an identifier "1" is located.

When an identifier "1" is found, the subroutine is finished and the operation is transferred to the main program. As shown in FIG. 4, "1" is outputted to the NVRAM erasing signal 109 to erase the memory segment having the identifier "1". After a certain time period necessary for erasing the memory segment, the NVRAM erasing signal 109 is returned to "0" to finish the erasing.

Next, it is judged whether or not the 4 lower order bits of the temporary register A are $F_{16}$. If they are $F_{16}$, it means that the memory segment is the lowermost row in the logic memory as shown in FIG. 3 and thus the 4 bits of lower order bits of the temporary register A are made equal to 0. That is, the physical address thus changed indicates the uppermost row of the memory array.

When the 4 lower order bits of A are not $F_{16}$, a "1" is added to the content of the temporary register A in order to shift the physical address of the memory segment to the lower side by one row.

The thus changed physical address is outputted to the physical address bus 104. Then, the data obtained through the logic data bus 103 is outputted to the 7 lower order bits of the physical data bus 105 and "1" is outputted to the most significant bit thereof, and "1" is outputted to the NVRAM read/write signal line 108 to execute the writing of the data and the identifier. After a certain time period necessary for writing data, "0" is outputted to the NVRAM read/write signal 108 to finish the writing.

When the data read/write signal 101 is "0", that is, in the case of a reading function, the subroutine shown in FIG. 5 is executed in order to find an identifier "1" in the same manner as the above. After a physical address of the identifier "1" is found, "0" is outputted to the NVRAM read/write signal line 108 and the lower 7 bits of the data, transmitted through the physical data bus 45 105, are outputted to the logic data bus 103.

In the operation explained above, the erasing or writing of data requires a certain time period. This is because the access time for the nonvolatile memory widely employed at present is longer than the operation speed of the microcomputer. If the writing and erasing operations can be conducted with any nonvolatile memory at a high speed, these operations can be made without delay.

In the operation shown in FIG. 3, the erasing of the identifier and the writing of "1" into the identifier of the nextly positioned memory segment are not conducted concurrently. If there is an accidental interruption of electric supply between these operations, there is a risk that all of the identifiers of the memory segments in a logic memory become "0". In order to avoid such a risk, the operation may be conducted in such a manner that "1" is first written into the portion of the memory segment which is to be stored with data, and then the memory segment having a physical address positioned just ahead is erased. In such a case, if an accidental interrupt occurs, there would be two memory segments having an identifier of "1". But, one may deem that the data stored in the memory segment having a larger physical address is the latest data.

When two memory segments are found as having an identifier of "1", it is necessary to erase the memory segment having a smaller physical address.

Preferred embodiments of the present invention have been explained by way of example, where the memory segment is composed of a first nonvolatile memory area or data memory capable having storing data of 7 bits and an identifier having 1 bit, as shown in FIG. 3. However, the above example should not be construed to restrict the technical scope of the invention, and thus a memory having other construction may be used.

Further, in the above example, the first nonvolatile memory area for storing data and the second nonvolatile memory area for storing an identifier are allotted with a same physical address in order to simplify the explanation of the operation. However, these may have different physical addresses, just as long as these addresses correspond to each other. Moreover, data memory may extend over a plurality of physical addresses if the stored data therein can be identified by the program which operates the controller.

The nonvolatile memory may be used as an independent device as well as in the form of an integrated circuit which can be manufactured by assembling the memory together with similar memorys on a single circuit substrate such as Si. Moreover, such an integrated circuits may include other devices having various functions, as is well known in the art.

Although the controller 100 is explained as a microprocessor in the above example, it may be composed of logic circuit having the same function.

Further, in the flow chart shown in FIGS. 4 and 5, the erasing is conducted separately of the writing, because these must be conducted separately with the NVRAM widely employed at present. Thus, if the writing can be conducted without erasing the formerly stored data, only the identifier need be changed to "0" and the data memory need not be erased.

We claim:

1. A nonvolatile memory for storing data comprising a plurality of logic memory blocks, each of which is used for storing data of a predetermined bit number and is composed of a plurality of memory segments, each of said memory segments including a first nonvolatile memory area capable of storing data of said predetermined bit number and a second nonvolatile memory area composed of one bit constituting an identifier for indicating whether or not the data stored in the corresponding first nonvolatile memory area is the latest written data of all the memory segments included in the same memory block, the memory being written in such a manner that the data is stored in only one memory segment at a time in each logic memory block and only the identifier included in the memory segment storing said data is made active within all the identifiers included in each memory block.

2. A nonvolatile memory as claimed in claim 1, wherein said first and second memory areas are made of electrically erasable programmable read only memory cells.

3. A nonvolatile memory as claimed in claim 1, which is realized in the form of an integrated circuit.

4. A memory for storing data comprising:
   at least one programmable memory circuit for storing data of a predetermined bit number, said programmable memory circuit including a plurality of memory segments, each memory segment including a first nonvolatile memory area for storing data of said predetermined bit number and a second nonvolatile memory area composed of one bit constituting an identifier for indicating whether or not the data stored in the corresponding first nonvolatile memory area is the latest written data of all the memory segments included in the same memory circuit, the memory being written in such a manner that the data is stored in only one memory segment at a time in each logic memory circuit and only the identifier included in the memory segment storing said data is made active among all the identifiers included in each memory circuit, and a controller operative in response to an access signal, comprising a read or write signal, for searching a memory segment storing the inputted data with reference to the identifiers included in the same memory circuit.

5. A memory as claimed in claim 4, wherein said first and second memory areas are made of electronically eraseable programmable read only memory cells.

6. A memory as claimed in claim 4, which is realized on a single semiconductor chip.

7. A memory as claimed in claim 4, wherein a plurality of said programmable memory circuits are combined, each of said memory circuits being given a unique logical address, and said controller comprises means operative to access the memory circuit identified by the inputted logical address when a read/write operation is executed.

8. A memory as claimed in claim 7, wherein said controller comprises means operative to access the memory circuit identified by the inputted logical address, when data is to be written, so as to erase in said accessed memory circuit the memory segment having the identifier indicating that the data is stored, and to write said inputted data into the memory segment next to said erased memory segment.

9. A memory as claimed in claim 7, wherein said controller comprises means operative to access the memory circuit identified by the inputted logical address, when data is to be read, so as to read from said accessed memory circuit the memory segment having the identifier indicating that the data is stored.

* * * * *

UNITED STATES PATENT AND TRADEMARK OFFICE
CERTIFICATE OF CORRECTION

PATENT NO. : 4,780,855
DATED : October 25, 1988
INVENTOR(S) : Norihiko Iida et al It is certified that error appears in the above-identified patent and that said Letters Patent is hereby corrected as shown below:

Column 2, line 53 after "divided", insert --into--;

Column 4, line 10 delete "slignal" insert --signal--;

Column 5, line 63 after "into the" insert --identifier--;

Column 6, line 9 delete "having storing data of", insert of storing data having--.

Signed and Sealed this

Tenth Day of April, 1990

Attest:

HARRY F. MANBECK, JR.

Attesting Officer

Commissioner of Patents and Trademarks